United States Patent
Yang et al.

(10) Patent No.: US 12,447,732 B2
(45) Date of Patent: Oct. 21, 2025

(54) METHOD FOR OFFSET CUTTING OF DISPLAY PANEL SUBSTRATES TO PREVENT SEPARATION OF SUBSTRATES UPON PLACEMENT, DISPLAY PANEL, AND DISPLAY DEVICE

(71) Applicants: Chuzhou HKC Optoelectronics Technology Co., Ltd., Chuzhou (CN); HKC CORPORATION LIMITED, Shenzhen (CN)

(72) Inventors: Qianqian Yang, Chuzhou (CN); Shishuai Huang, Chuzhou (CN); Bing Han, Chuzhou (CN); Haijiang Yuan, Chuzhou (CN)

(73) Assignees: CHUZHOU HKC OPTOELECTRONICS TECHNOLOGY CO., LTD., Chuzhou (CN); HKC CORPORATION LIMITED, Shenzhen (CN)

( * ) Notice: Subject to any disclaimer, the term of this patent is extended or adjusted under 35 U.S.C. 154(b) by 375 days.

(21) Appl. No.: 18/108,650

(22) Filed: Feb. 12, 2023

(65) Prior Publication Data
US 2023/0191770 A1 Jun. 22, 2023

Related U.S. Application Data

(62) Division of application No. 17/382,298, filed on Jul. 21, 2021, now Pat. No. 11,602,927.

(51) Int. Cl.
| B32B 38/18 | (2006.01) |
| B32B 17/10 | (2006.01) |
| H01L 21/78 | (2006.01) |

(52) U.S. Cl.
CPC .......... *B32B 38/185* (2013.01); *B32B 17/10* (2013.01); *B32B 2457/20* (2013.01)

(58) Field of Classification Search
CPC ........ B32B 38/185; B32B 17/10; H01L 21/78
See application file for complete search history.

(56) References Cited

U.S. PATENT DOCUMENTS

| 2005/0225710 A1 | 10/2005 | Yi |
| 2011/0217524 A1 | 9/2011 | Kim |
| 2015/0323830 A1 | 11/2015 | Peng et al. |

(Continued)

FOREIGN PATENT DOCUMENTS

| CN | 1439926 A | 9/2003 |
| CN | 1486265 A | 3/2004 |

(Continued)

*Primary Examiner* — Joseph L Williams

(57) ABSTRACT

The present application discloses a cutting method for a display panel, a display panel and a display device, the cutting method for a display panel including a cutting stage of a side edge of a binding area and a cutting stage of a side edge of a non-binding area, the cutting stage of a side edge of a non-binding area includes steps of: aligning a cutter according to an alignment mark preset on the side edge of the non-binding area on the display panel, so that a cutter on a second substrate side is closer to a display area of the display panel than a cutter on a first substrate side, and cutting the first substrate and the second substrate by the cutter on the second substrate side and the cutter on the first substrate side respectively.

10 Claims, 3 Drawing Sheets

(56) References Cited

U.S. PATENT DOCUMENTS

| | | | |
|---|---|---|---|
| 2017/0200681 A1 | 7/2017 | He et al. | |
| 2024/0032353 A1* | 1/2024 | Liu | H10K 59/131 |
| 2024/0048647 A1* | 2/2024 | Hu | H04M 1/0269 |

FOREIGN PATENT DOCUMENTS

| | | |
|---|---|---|
| CN | 104503144 A | 4/2015 |
| CN | 105044956 A | 11/2015 |
| CN | 105607353 A | 5/2016 |
| JP | 10209086 A | 8/1998 |
| KR | 20060072556 A | 6/2006 |
| TW | 201107079 A | 3/2011 |
| TW | 201513187 A | 4/2015 |

* cited by examiner

METHOD FOR OFFSET CUTTING OF DISPLAY PANEL SUBSTRATES TO PREVENT SEPARATION OF SUBSTRATES UPON PLACEMENT, DISPLAY PANEL, AND DISPLAY DEVICE

CROSS-REFERENCES TO RELATED APPLICATION

This application is a division of U.S. patent application Ser. No. 17/382,298 filed Jul. 21, 2021 and issued on Mar. 14, 2023 as U.S. Pat. No. 11,602,9271, which is hereby incorporated by reference herein in its entirety.

TECHNICAL FIELD

The present application relates to the technical field of display processing, in particular to a cutting method for a display panel, a display panel and a display device.

BACKGROUND

The statements herein merely provide background information related to the present application and do not necessarily constitute the conventional art.

With the advancement and development of science and technology and the improvement of the living standard of people, the use of display panels is deepened into every family, changing communication mode of people. The display panels are manufactured in large quantities and continuously improved, including technical improvements on the manufacturing, assembling, transporting and the like of the display panels.

However, there are many problems to be solved in the process of cutting and assembling the display panel, and in the process of cutting the display panel, the machine table including a cutter on a second substrate side and a cutter on a first substrate side simultaneously cuts the substrates on both sides. Ideally, the glass of the second substrate is aligned with that of the first substrate when cutting from the first substrate side and the second substrate side by a cutter. However, the second substrate may be slightly larger than the first substrate after cutting with the cutter due to cutting accuracy. At this case, the cut display panel is placed in a module, and because the first substrate is located on one side of the second substrate close to the module, when the display panel is placed, the first substrate is first placed in the module, the second substrate is easy to collide with the edge of the mold relative to the glass protrusion of the first substrate, and then the second substrate is separated from the first substrate, leading the display panel is damaged.

SUMMARY

The purpose of the present application is to provide a cutting method for a display panel, a display panel and a display device so as to prevent a second substrate from being separated from a first substrate during an assembling process.

The present application discloses a cutting method of a display panel, which includes a cutting the side edge of a binding area and a cutting stage of a side edge of a non-binding area, where the cutting stage of the side edge of the non-binding area includes steps of:

aligning a cutter according to an alignment mark preset on the side edge of the non-binding area on the display panel, so that a cutter on a second substrate side is closer to a display area of the display panel than a cutter on a first substrate side, and cutting the first substrate and the second substrate by the cutter on the second substrate side and the cutter on the first substrate side respectively, where the binding area is configured for binding the display panel and at least one chip on film.

Optionally, the step of aligning a cutter according to an alignment mark preset on the side edge of the non-binding area on the display panel, so that a cutter on a second substrate side is closer to a display area of the display panel than a cutter on a first substrate side includes:

controlling the cutter on the second substrate side and the cutter on the first substrate side to be aligned on the same straight line according to the alignment mark preset on the side edge of the non-binding area on the display panel, and controlling the cutter on the second substrate side to move a preset distance towards the display area of the display panel, so that the cutter on the second substrate side is closer to the display area of the display panel than the cutter on the first substrate side.

Optionally, in the step of aligning a cutter according to an alignment mark preset on the side edge of the non-binding area on the display panel, so that a cutter on a second substrate side is closer to a display area of the display panel than a cutter on a first substrate side:

the cutter on the second substrate side and the cutter on the first substrate side are aligned according to the alignment marks of the non-binding areas on the display panel, where the position of the alignment mark on the second substrate side is different from that of the alignment mark on the first substrate side, and the alignment mark on the second substrate side is closer to the display area of the display panel than the alignment mark on the first substrate side, so that the cutter on the second substrate side is closer to the display area of the display panel than the cutter on the first substrate side.

Optionally, in the step of aligning a cutter according to an alignment mark preset on the side edge of the non-binding area on the display panel, so that a cutter on a second substrate side is closer to a display area of the display panel than a cutter on a first substrate side: a relative distance between the cutter on the second substrate side and the cutter on the first substrate side is set as X, where 10 µm≤X≤100 µm.

Optionally, the cutting stage of the side edge of the binding area includes:

aligning according to the alignment mark preset on a binding area on the display panel, so that the cutter on the second substrate side is closer to the display area of the display panel than the cutter on the first substrate side, and cutting the first substrate and the second substrate by the cutter on the second substrate side and the cutter on the first substrate side respectively.

The present application also discloses a display panel, the display panel divided into a display area and a non-display area, the display panel includes: a first substrate, a second substrate disposed opposite to the first substrate, and at least one chip on film bound to at least one side edge of the first substrate, where the edge of the first substrate exceeds the edge of the corresponding second substrate at the side edge where the first substrate is bound to the chip on film, and the edge of the second substrate is closer to the display area of the display panel than the edge of the first substrate.

Optionally, the edge of the first substrate also exceeds the edge of the corresponding second substrate at the side edge where the first substrate is bound to the chip on film, and the edge of the second substrate is closer to the display area of the display panel than the edge of the first substrate.

Optionally, the side edge of the first substrate bound to the chip on film is the side edge of the binding area, the side edge of the first substrate not bound to the chip on film is the side edge of the non-binding area, the relative distance between the side edge of the non-binding area of the second substrate and the side edge of the non-binding area of the first substrate is X in the direction parallel to the first substrate and the second substrate, where 10 µm≤X≤50 µm.

Optionally, the relative distance between the side edge of the binding area of the second substrate and the side edge of the binding area of the first substrate is Y in the direction parallel to the first substrate and the second substrate, where 200 µm≤Y≤500 µm.

The present application also discloses a display device, including the above mentioned display panel.

With respect to a solution that the cutter on the second substrate side and the cutter on the first substrate side simultaneously cut the first substrate and the second substrate of the display panel with the cutting lines of two cutters being in the same straight line, the present application makes the cutter on the second substrate side retract inwardly towards the display area relative to the cutter on the first substrate side when cutting, so as to effectively avoid that the second substrate on the non-binding area is larger than the first substrate on the non-binding area due to the cutting precision, and avoid that the second substrate is separated from the first substrate because the second substrate is easy to collide with the frame of the display module due to the second substrate being larger than the first substrate when display panel is placed or transported into the display module, thus avoiding panel damages when aligning module.

BRIEF DESCRIPTION OF DRAWINGS

The accompanying drawings, which are included to provide a further understanding of embodiments of the present application and constitute a part of the specification, illustrate embodiments of the application and, together with the text description, explain the principles of the application. Obviously, the drawings in the following description are merely some embodiments of the present application, and those skilled in the art can obtain other drawings according to the drawings without any inventive labor. In the drawings.

DETAILED DESCRIPTION OF EMBODIMENTS

It should be understood that the terminology, specific structural and functional details disclosed are merely exemplary for the purpose of describing specific embodiments. However, the present application may be embodied in many alternative forms and should not be construed as being limited to the embodiments set forth herein.

In the description of the present application, the terms "first" and "second" are only for the purpose of description and cannot be construed to indicate relative importance or imply an indication of the number of technical features indicated. Therefore, unless otherwise stated, a feature defined as "first" and "second" may explicitly or implicitly include one or more of the features; "multiple" means two or more. The term "include" and any variations thereof are intended to be inclusive in a non-closed manner, that is, the presence or addition of one or more other features, integers, steps, operations, units, components and/or combinations thereof may be possible.

In addition, the terms "center", "horizontally", "up", "down", "left", "right", "vertical", "horizontal", "top", "bottom", "inner", "outer" and the like for indicating an orientation or positional relationship are based on the description of the orientation or relative positional relationship shown in the accompanying drawings, and are only simplified description facilitating description of the application, and are not intended to indicate that the device or element referred to must have a particular orientation, be configured and operated in a particular orientation, and therefore cannot be construed as limiting the present application.

In addition, unless expressly specified and defined otherwise, the terms "mount", "attach" and "connect" are to be understood broadly, for example, it can be a fixed connection, a detachable connection, or an integral connection; it can be an either mechanical connection or an electrical connection; it can be a direct connection or an indirect connection through an intermediate medium, or an internal connection between two elements. For those skilled in the art, the specific meaning of the above terms in this application can be understood according to the specific circumstances.

The present application will now be described in details by reference to the accompanying drawings and optional embodiments.

Figure 1:
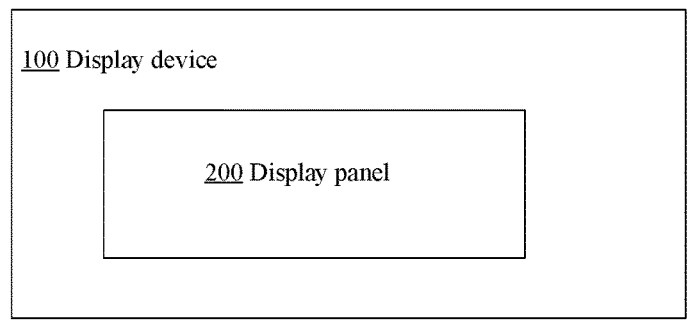
FIG. 1 is a structural schematic diagram of a display device according to an embodiment of the present application.

FIG. 1 is a structural schematic diagram of a display device 100, including a display panel 200. The display panel 200 includes: a first substrate 210, a second substrate 220, and at least one chip on film (COF) 215, the second substrate 220 disposed opposite to the first substrate 210. The first substrate 210 may be an array substrate, and the second substrate 220 may be a color filter substrate provided with a color filter. The display panel 200 is divided into a display area 211 and a non-display area 212, and the chip on film 215 is bound to at least one side of the first substrate 210, where the edge of the first substrate exceeds the edge of the corresponding second substrate at the side edge where the first substrate is not bound to the chip on film, and the edge of the second substrate is closer to the display area of the display panel than the edge of the first substrate.

Figure 2:
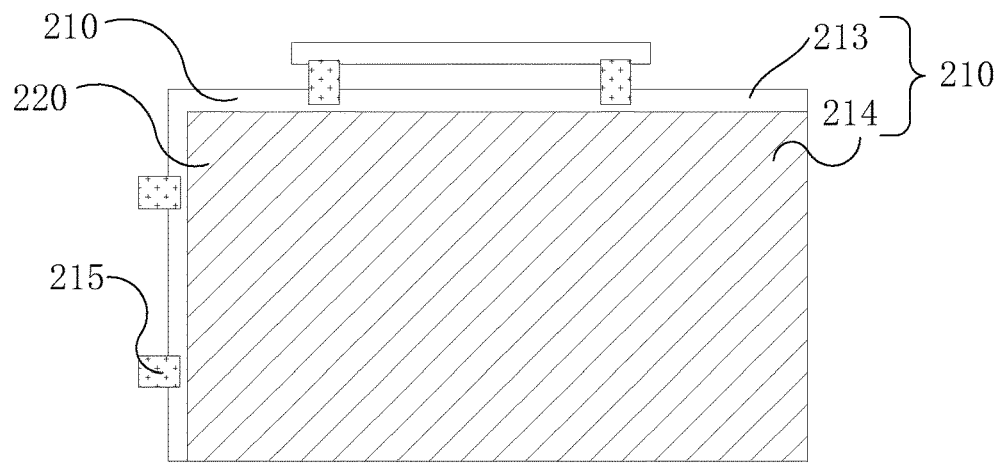
FIG. 2 is a structural schematic diagram of a cut display panel according to an embodiment of the present application.
Figure 3:
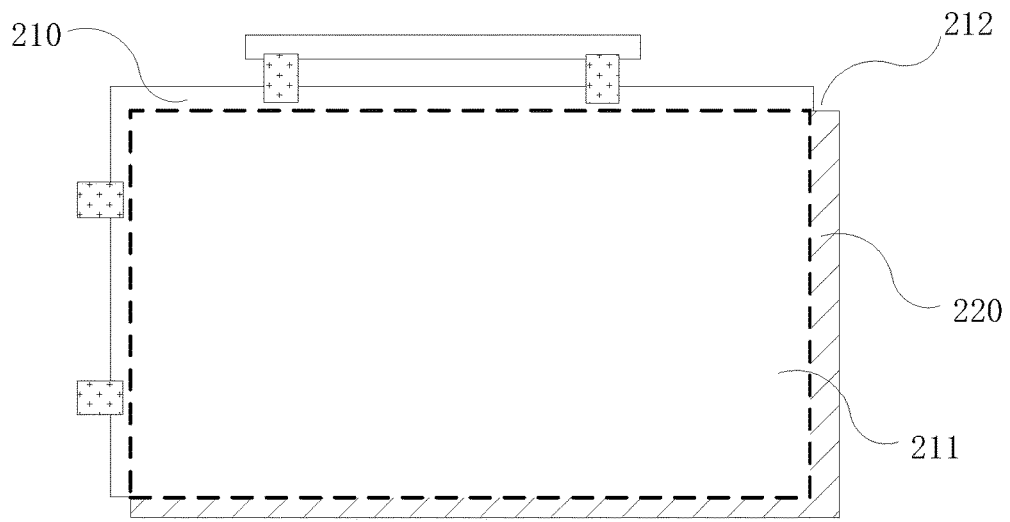
FIG. 3 is a structural schematic diagram of another cut display panel according to an embodiment of the present application.

The cutting machine table of the display panel includes a cutter on the second substrate side and a cutter on the first substrate side cutting substrates on the two sides simultaneously. Ideally, the glass of the second substrate 220 is aligned with that of the first substrate 210 when cutting from the first substrate side 210 and the second substrate side by the cutter, as shown in FIG. 2. However, the second substrate 220 may be slightly larger than the first substrate 210 after cutting with the cutter due to cutting accuracy, as shown in FIG. 3. At this case, the cut display panel 200 is placed in a module, and because the first substrate 210 is located on one side of the second substrate 220 close to the module, when the display panel is placed, the first substrate 210 is first placed in the module, the second substrate 220 is easy to collide with the edge of the mold relative to the convex glass of the first substrate 210, and then the second substrate 220 is separated from the first substrate 210, leading the display panel 200 is damaged.

Figure 4:
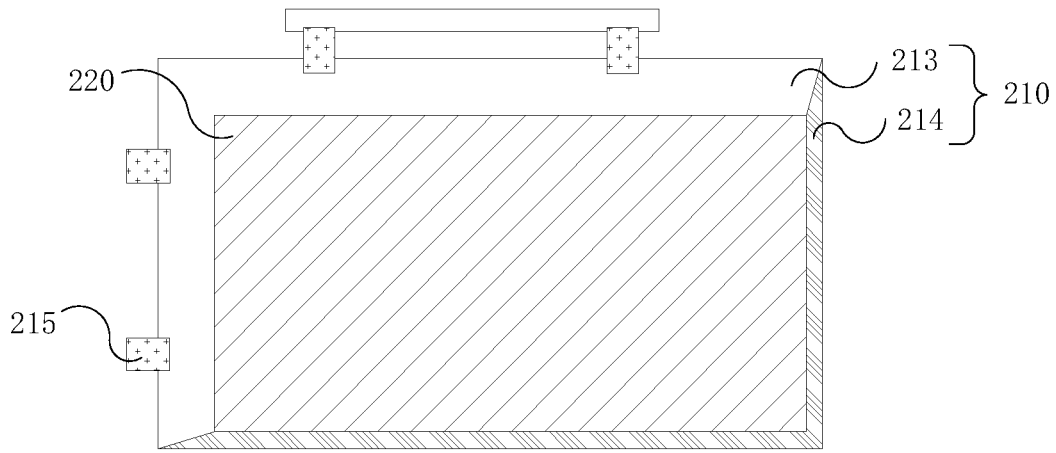
FIG. 4 is a structural schematic diagram of another cut display panel according to another embodiment of the present application.

As shown in FIG. 4, FIG. 4 is a structural schematic diagram of a cut display panel 200 according to the present application, the area where the first substrate 210 is bound to the chip on film 215 is a binding area 213, the side edge of the first substrate 210 bound to the chip on film 215 is the side edge of the binding area, and the side edge of the first substrate 210 not bound to the chip on film 215 is the side edge of the non-binding area. The edge of the first substrate 210 exceeds the edge of the corresponding second substrate 220 at the side edge where the first substrate 210 is bound to the chip on film 215, the edge of the first substrate 210 also exceeds the edge of the corresponding second substrate 220 at the side edge where the first substrate 210 is not bound to the chip on film 215, the edge of the second substrate 220 is closer to the display area 211 of the display panel 200 than the edge of the first substrate 210, the side edge of the first substrate bound to the chip on film is the side edge of the binding area, the side edge of the first substrate not bound to the chip on film is the side edge of the non-binding area, a relative distance between the side edge of the non-binding area of the second substrate and the side edge of the non-binding area of the first substrate is X in the direction parallel to the first substrate and the second substrate, where 10 µm≤X≤50 µm; specifically, X can be set as 50 µm, because the glass of display panel 200 is only 0.5 mm, the cutter is retracted by 50 µm, which avoids that the display panel 200 breaks when it only can be supported by the cutter on one side without support on the other side within a certain area due to large distance between the cutter on the second substrate side and the cutter on the first substrate side.

Figure 5:
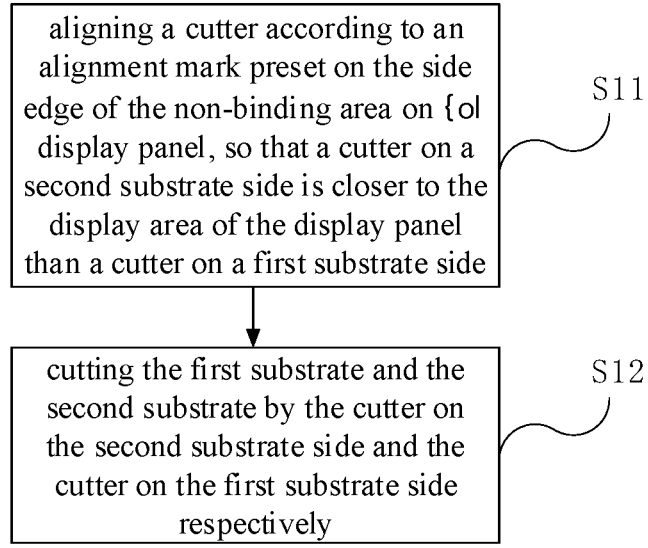
FIG. 5 is a flowchart of a cutting method for a display panel according to an embodiment of the present application.

FIG. 5 shows a flowchart of a cutting method for a display panel, which includes a cutting stage of a side edge of a binding area and cutting stage of a side edge of a non-binding area, where the step of cutting the side edge of a non-binding area includes steps of:

S11: aligning a cutter according to an alignment mark preset on the side edge of the non-binding area on the display panel, so that a cutter on a second substrate side is closer to the display area of the display panel than a cutter on a first substrate side, and S12: cutting the first substrate and the second substrate by the cutter on the second substrate side and the cutter on the first substrate side respectively.

With respect to a solution that the cutter on the second substrate side and the cutter on the first substrate side simultaneously cut the first substrate 210 and the second substrate 220 of the display panel 200 with the two cutters being in the same straight line, and the second substrate 220 on the non-binding area 214 is larger than the first substrate 210 on the non-binding area due to the cutting precision, the present application makes the cutter on the second substrate side retract inwardly corresponding to the cutter on the first substrate side when cutting, so as to effectively avoid that the second substrate 220 is larger than the first substrate 210 due to the cutting precision, and avoid that the second substrate 220 is separated from the first substrate 210 because the second substrate 220 is easy to collide with the frame of the mold due to the second substrate 220 being larger than the first substrate 210 when display panel is placed into the module, thus avoiding panel damages when aligning module.

In step S11, the cutter on the second substrate side and the cutter on the first substrate side may be aligned by the same alignment mark, that is, after the cutter on the second substrate side and the cutter on the first substrate side are aligned on the same straight line according to the alignment mark preset on the side edge of non-binding area on the display panel 200, the cutter on the second substrate side moves to the display area 211 of the display panel 200 by a certain distance, so that the cutter on the second substrate side is closer to the display area 211 of the display panel 200 than the cutter on the first substrate side. Placing the aligned cutters and then removing the cutters to the set position can effectively reduce errors produced when the cutters are aligned. In step S11, the cutter on the second substrate side and the cutter on the first substrate side may be aligned by different alignment marks, that is, the cutter on the second substrate side is aligned according to the alignment mark on the second substrate side preset on the side edge of the non-binding area on the display panel 200, and the cutter on the first substrate side is aligned according to the alignment mark on the first substrate side preset on the side edge of the non-binding area on the display panel 200. The position of the alignment mark on the second substrate side is different from that of the alignment mark on the first substrate side, and the alignment position of the cutter on the second substrate side is different from that of the cutter on the first substrate side, so that the cutter on the second substrate side is closer to the display area 211 of the display panel 200 than the cutter on the first substrate side. The cutter is directly placed to the determined position through the alignment mark, so that the moving step of the cutter is omitted, and the cutting time for the display panel 200 is saved.

Figure 6:
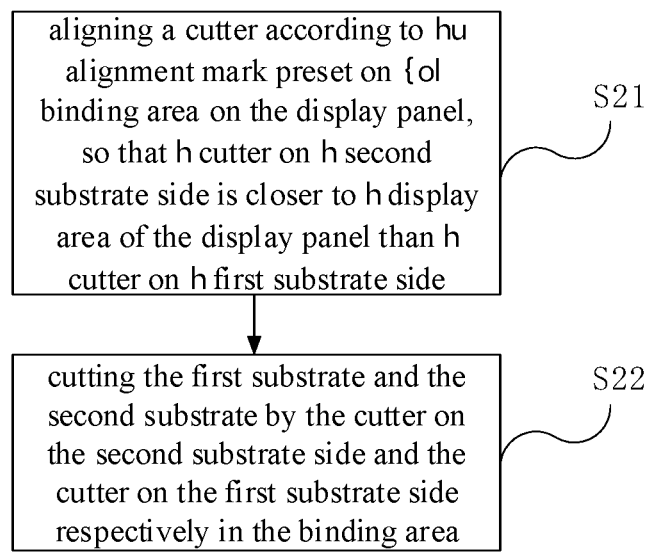
FIG. 6 is a flowchart of a cutting method for a display panel according to an embodiment of the present application.

The edge of the first substrate also exceeds the edge of the corresponding second substrate in the binding area. As shown in FIG. 6, the cutting stage of the side edge of the non-binding area includes:

S21: aligning a cutter according to an alignment mark preset on the binding area on the display panel, so that a cutter on a second substrate side is closer to a display area of the display panel than a cutter on a first substrate side, and S22: cutting the first substrate and the second substrate by the cutter on the second substrate side and the cutter on the first substrate side respectively in the binding area.

The area of the second substrate 220 is smaller than that of the first substrate 210, and each side of the second substrate 220 is shorter than that of the first substrate 210, i.e., the second substrate 220 has a shorter width than the first substrate 210, the second substrate 220 has a shorter length than the first substrate 210, and each side of the second substrate 220 is not overlapped with that of the first substrate 210, so that it is ensured that the second substrate 220 does not collide with a mold due to glass protrusion in the process of assembling the module, and is separated from the first substrate 210, and it is further ensured that the display panel 200 has enough binding area 213 for circuit arrangement.

The relative distance between the side edge of the non-binding area of the second substrate 220 and the side edge of the non-binding area of the first substrate 210 is X in the direction parallel to the first substrate 210 and the second substrate 220, where 10 μm≤X≤100 μm, and the cutting precision of the cutting machine table is greater than or equal to 2 μm and less than or equal to 10 μm. The relative distance X set between the side edge of the non-binding area of the second substrate 220 and the side edge of the non-binding area of the first substrate 210 is larger than the cutting precision of the cutting machine table; the cutter on the second substrate side is moved to the display area 211 by a distance larger than or equal to 10 μm and smaller than or equal to 100 μm when cutting, which ensures that an error space which is enough to exceed the cutting precision can be reserved, preventing the two substrates from separating when the second substrate 220 is larger than the first substrate 210. If the distance X is too large, the structure on the frame of the second substrate side is affected, thus affecting sealant sealing effect of the display panel 200 and the setting of the narrow frame of the display panel 200. Specifically, X can be set as 50 μm, because the glass of display panel 200 is only 0.5 mm, the cutter is retracted by 50 μm, which avoids that the display panel 200 breaks when it only can be supported by the cutter on one side without support on the other side within a certain area due to large distance between the cutter on the second substrate side and the cutter on the first substrate side, thus effectively solving yield loss in the module alignment process, and avoiding the separation caused by cutting precision and the panel loss when the module is aligned.

The relative distance between the side edge of the binding area of the second substrate 220 and the side edge of the binding area of the first substrate 210 is Y in the direction parallel to the first substrate 210 and the second substrate 220, where 200 μm≤Y≤500 μm, which ensures that sufficient space for disposing the chip on film 215 in the binding area 213, avoids that the edge of the second substrate 220 in the non-binding area 214 exceeds the edge of the first substrate 210, and avoids the space waste caused by excessive distance between two edges; 200 μm≤Y≤500 μm ensures that the moving distance of the cutter on the second substrate side relative to the cutter on the first substrate side ensures that the first substrate side has enough binding areas 213 for wiring, thereby avoiding that the wires on the binding areas 213 of the display panel 200 are too thin to break due to too narrow binding areas 213, and improving yield of products. As can be seen from the above, X is much less than Y, and X is preferably one tenth of Y.

The non-binding area 214 include a first non-binding area 214 and a second non-binding area 214 perpendicular to each other, the first non-binding area 214 has a length equal to that of the first substrate 210, the second non-binding area 214 has a length equal to the width of the first substrate 210, a relative distance between the side edge of the first non-binding area of the second substrate and the side edge of the first non-binding area of the first substrate is X1, and a relative distance between the side edge of the second non-binding area of the second substrate and the side edge of the second non-binding area of the first substrate is X2, where X1<X2. Such design sets different X1 and X2 corresponding to the different length and width of display panel, and X1<X2, which makes protruding first substrate has a better stress-bearing performance.

It should be noted that, the limitation of the steps involved in this solution, without affecting the implementation of the specific solution, is not determined to limit the sequence of steps, and the previous steps may be executed first, later, or even simultaneously, and shall be deemed to fall within the scope of the present application as long as the solution can be implemented.

The above content is a further detailed description of the present application in conjunction with specific, optional embodiments, and it is not to be construed that specific embodiments of the present application are limited to these descriptions. For those of ordinary skill in the art to which this application belongs, a number of simple derivations or substitutions may be made without departing from the spirit of this application, all of which shall be deemed to fall within the scope of this application.

What is claimed is:

1. A display panel, comprising:
a first substrate,
a second substrate, the second substrate disposed opposite to the first substrate, and
at least one chip on film bound to at least one side edge of the first substrate,
wherein the display panel is divided into a display area and a non-display area, an edge of the first substrate exceeds an edge of the corresponding second substrate at a side edge where the first substrate is not bound to the chip on film, and the edge of the second substrate is closer to the display area of the display panel than the edge of the first substrate.

2. The display panel according to claim 1, wherein the edge of the first substrate also exceeds the edge of the corresponding second substrate at a side edge where the first substrate is bound to the chip on film, and the edge of the second substrate is closer to the display area of the display panel than the edge of the first substrate.

3. The display panel according to claim 2, wherein the side edge of the first substrate bound to the chip on film is a side edge of a binding area, and the side edge of the first substrate not bound to the chip on film is a side edge of a non-binding area,
a relative distance between the side edge of the non-binding area of the second substrate and the side edge of the non-binding area of the first substrate is X in the direction parallel to the first substrate and the second substrate,
wherein 10 μm≤X≤50 μm.

4. The display panel according to claim 3, wherein a relative distance between the side edge of the binding area of the second substrate and the side edge of the binding area of the first substrate is Y in the direction parallel to the first substrate and the second substrate,
wherein 200 μm≤Y≤500 μm.

5. The display panel according to claim 4, wherein the value of X is greater than 0 and less than one tenth of the value of Y.

6. The display panel according to claim 3, wherein the non-binding area comprises a first non-binding area and a second non-binding area perpendicular to each other.

7. The display panel according to claim 6, wherein the first non-binding area has a length equal to the length of the first substrate, the second non-binding area has a length equal to the width of the first substrate, a relative distance between the side edge of the first non-binding area of the second substrate and the side edge of the first non-binding area of the first substrate is X1, and a relative distance between the side edge of the second non-binding area of the second substrate and the side edge of the second non-binding area of the first substrate is X2, wherein X1<X2.

8. The display panel according to claim 4, wherein a glass thickness of the display panel is 0.5 mm.

9. A display device, comprising a display panel,
wherein the display panel comprising a first substrate, a second substrate disposed opposite to the first substrate, and at least one chip on film bound to at least one side edge of the first substrate, and
wherein the display panel divided into a display area and a non-display area, an edge of the first substrate exceeds an edge of the corresponding second substrate at a side edge where the first substrate is not bound to the chip on film, and the edge of the second substrate is closer to the display area of the display panel than the edge of the first substrate;
the edge of the first substrate also exceeds the edge of the corresponding second substrate at the side edge where the first substrate is bound to the chip on film, and the edge of the second substrate is closer to the display area of the display panel than the edge of the first substrate.

10. The display device according to claim 9, wherein the side edge of the first substrate bound to the chip on film is a side edge of a binding area, and the side edge of the first substrate not bound to the chip on film is a side edge of a non-binding area,
a relative distance between the side edge of the non-binding area of the second substrate and the side edge of the non-binding area of the first substrate is X in the direction parallel to the first substrate and the second substrate,
a relative distance between the side edge of the binding area of the second substrate and the side edge of the binding area of the first substrate is Y in the direction parallel to the first substrate and the second substrate,
wherein 10 µm≤X≤50 µm, 200 µm≤Y≤500 µm, and 0<X<0.1Y.

* * * * *